United States Patent
Hung et al.

(10) Patent No.: US 9,349,736 B2
(45) Date of Patent: May 24, 2016

(54) METHOD FOR MANUFACTURING HIGH-STRENGTH STRUCTURAL STACKED CAPACITOR

(71) Applicant: INOTERA MEMORIES, INC., Taoyuan County (TW)

(72) Inventors: Hai-Han Hung, Taouan County (TW); Yi-Ren Lin, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 80 days.

(21) Appl. No.: 14/228,727

(22) Filed: Mar. 28, 2014

(65) Prior Publication Data
US 2015/0171088 A1    Jun. 18, 2015

(30) Foreign Application Priority Data
Dec. 13, 2013  (TW) .............................. 102146144 A

(51) Int. Cl.
*H01L 21/20* (2006.01)
*H01L 27/108* (2006.01)
*H01L 49/02* (2006.01)
*H01L 21/768* (2006.01)

(52) U.S. Cl.
CPC ...... *H01L 27/10814* (2013.01); *H01L 21/7682* (2013.01); *H01L 27/10817* (2013.01); *H01L 27/10855* (2013.01); *H01L 28/91* (2013.01)

(58) Field of Classification Search
CPC .................................................. H01L 21/7682
See application file for complete search history.

(56) References Cited

U.S. PATENT DOCUMENTS

| 6,482,695 B1 * | 11/2002 | Kim | ............................. 438/253 |
| 2001/0005611 A1 * | 6/2001 | Kim | ............................. 438/239 |
| 2006/0292810 A1 * | 12/2006 | Seo et al. | ..................... 438/381 |

FOREIGN PATENT DOCUMENTS

TW    I399831    6/2013

* cited by examiner

*Primary Examiner* — Stanetta Isaac
(74) *Attorney, Agent, or Firm* — Rosenberg, Klein & Lee

(57) ABSTRACT

The instant disclosure relates to a method for manufacturing high-strength structural stacked capacitor. The novel feature of the instant disclosure is forming a part of upper electrode layer to cover the first/outer surface of each of the lower electrode layers before removing the sacrificial layer, and forming another part of upper electrode layer to cover the second/inner surface of each of the lower electrode layers after removing the sacrificial layer. Hence, the structure strength of the lower electrode layer in all process steps has been improved.

8 Claims, 10 Drawing Sheets

METHOD FOR MANUFACTURING HIGH-STRENGTH STRUCTURAL STACKED CAPACITOR

BACKGROUND OF THE INVENTION

1. Field of the Invention

The instant disclosure relates to a semiconductor manufacturing technology; in particular, to a method for manufacturing high-strength structural stacked capacitor.

2. Description of Related Art

Dynamic random access memory (DRAM) is one kind of widely used integrated circuit element. With the vigorous development of semiconductor industry, the dimension of integrated circuit elements nowadays range from micron size to submicron size. For DRAM, that is to say, the cross-sectional area of each capacitor and each gap between capacitors become smaller. Basically, the better operating capability of computer software becomes, the greater memory capacitance of computer hardware need. Facing up to the problem of the capacitor dimension become smaller, but the memory capacitance must be increased. The traditional method of manufacturing DRAM capacitors certainly needs to be improved.

Generally, the following methods are often used to increase capacitance to store the bits of data. The first method is to increase the dielectric constant of the dielectric material. The second method is to decrease the thickness of the dielectric layer. The third method is to increase the electrode contact-surface area. However, in view of the resolution of pattern transfer is increased and the critical dimension of the line width is reduced. Limitation exists for improving lithography by only optical improvement.

Taiwan patent no. 1399831 discloses one type of double-side capacitor structure having a plurality of supports, each of which may connect at least two adjacent lower electrodes. However, in order to integrate with high density DRAM, each capacitor must provide sufficient capacitance to maintain the signal strength. In this way, the design of DRAM will focus on the correlation between the height and thickness of the electrode and the capacitance. In summary, the increased height or the decreased thickness of the capacitor electrode will result in weakening the structural strength then twin bit failure occurs.

SUMMARY OF THE INVENTION

The object of the instant disclosure is to provide a method for manufacturing high-strength structural stacked capacitor which can overcome limitations of the traditional one. Moreover, double-side capacitors manufactured by the method have larger electrode contact-surface area can be allowed to increase capacitance as well as to ensure that the structural strength of the electrode structure has been improved to prevent the lower electrode from toppling in wet-etching.

In order to achieve the aforementioned objects, according to an embodiment of the instant disclosure, a method for manufacturing high-strength structural stacked capacitor comprises the following steps. The first step is to form a laminate structure on a substrate, wherein the laminate structure includes a sacrificial layer disposed above the substrate. The next step is to form a plurality of capacitor trenches in the laminate structure. The next step is to form a lower electrode layer to cover a sidewall of each of the capacitor trenches. The next step is to continually form a first dielectric layer and a first upper electrode on the laminate structure, wherein the first dielectric layer is deposited over the capacitor trenches to cover a first surface of each of the lower electrode layers, and wherein the first upper electrode layer is deposited over the capacitor trenches to cover the surface of the first dielectric layers. The next step is to selectively remove the first upper electrode layer, the first dielectric layer, and the lower electrode layers to form a plurality of openings that expose the sacrificial layer. The last step is to remove the sacrificial layer to form a plurality of etching spaces between the capacitor trenches via the openings to expose a second surface of each of the lower electrode layers.

Base on above, the method begins to form a part of upper electrode layer to cover a first surface of each of the lower electrode layers before a wet etching process. After that, another part of upper electrode layer is formed to cover a second surface of each the lower electrode layers after the wet etching process. Therefore, the high-strength structural lower electrode can be achieved during overall process to improve production yield.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
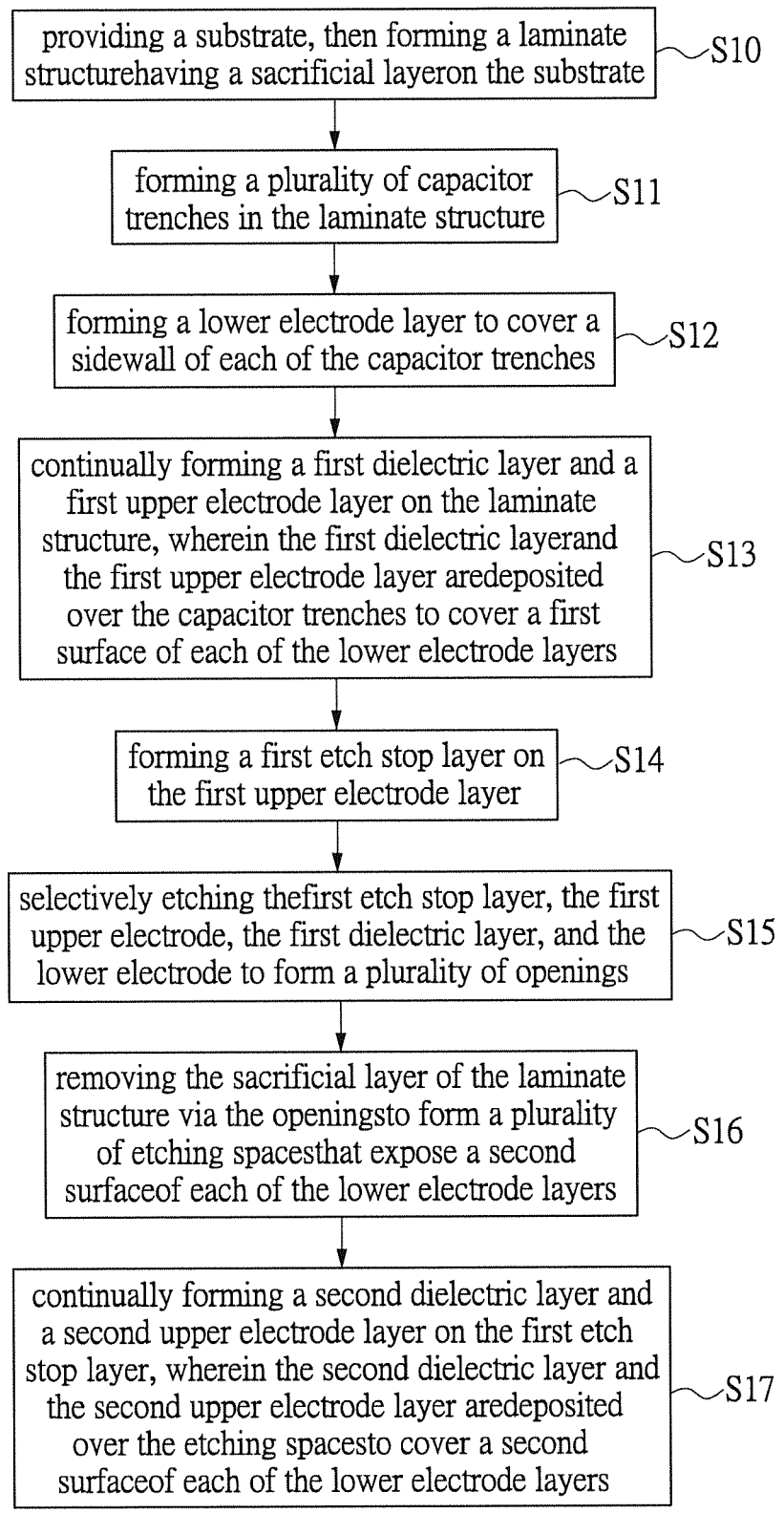
FIG. 1A shows a process flow diagram of a method for manufacturing high-strength structural stacked capacitor according to an embodiment of the instant disclosure.
Figure 2:
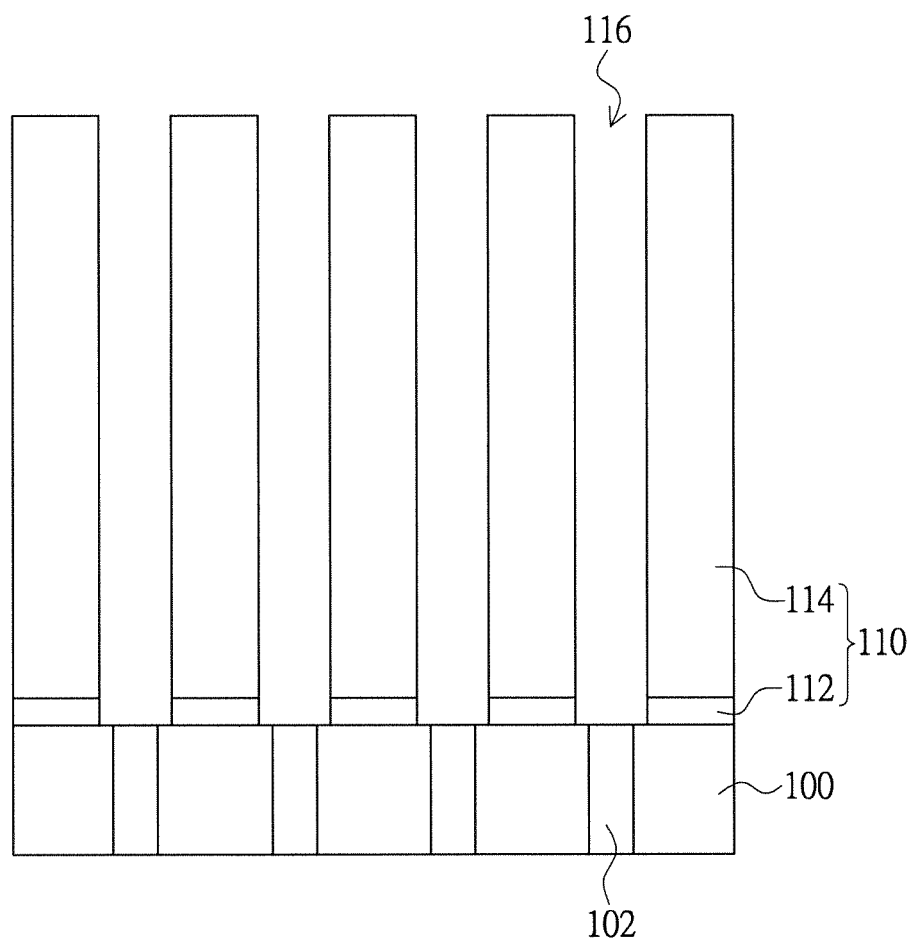
FIGS. 2-9 are cross-sectional diagrams illustrating the processing steps of the method for manufacturing high-strength structural stacked capacitor.

Please refer to FIG. 1A as well as FIGS. 2 to 7. FIG. 1A is a process diagram of a method for manufacturing high-strength structural stacked capacitor according to a preferred embodiment of the instant disclosure. FIGS. 2 to 7 are cross-sectional views illustrating the processing steps of the method. Basically, the method of the instant disclosure has the following steps:

Step S10 is providing a substrate 100, and then forming a laminate structure 110 having a sacrificial layer 114 on a substrate 100. Referring to FIG. 2, the substrate 100, in practice, can be a silicon substrate or any other suitable substrate having a plurality of contact plugs 102 formed therein. Moreover, the contact plugs 102 is made of conducting material selecting from doped polysilicon, metal (ex. tungsten), etc., and be exposed to the surface of the substrate 100 to make electrical connections between the stacked capacitors subsequently formed thereabove and the elements such as transistor, wiring, etc., arranged therebelow.

The laminate structure 110 includes a liner layer 112 disposed on the substrate 100 and a sacrificial layer 114 disposed on the liner layer 112. In practice, the liner layer 112 can be made of silicon nitride (SiN) and be formed via chemical vapor deposition (CVD). The sacrificial layer 114 can be made of boro-phosphosilicate glass (BPSG) material, phosphosilicate glass (PSG), undoped silicate glass (USG), and/or tetra-ethyl-ortho silicate glass (TEOS). On the other hand, the sacrificial layer 114 can be formed via high density plasma chemical vapor deposition (HDP CVD), plasma-enhanced chemical vapor deposition (PECVD), or any other suitable deposition. In principle, the sacrificial layer 114 can be made of any other oxide material or silicon material according to the etching solution of the subsequent process.

Step S11 is forming a plurality of capacitor trenches 116 in the laminate structure 110. Referring to FIG. 2, step S11 comprises, but not limited to, the following steps. A photoresist material is spin-coated on the sacrificial layer 114 in the first place. The photoresist material is exposed and developed through a patterned mask to form a patterned photoresist layer (not shown) in the second place. Further, a process of etching is conducted to form the capacitor trenches 116 that pass through the sacrificial layer 114 and the liner layer 112 by using the patterned photoresist layer as the etch mask. Accordingly, the contact plugs 102 can be exposed to the bottom ends of the capacitor trenches 116 respectively. Finally, another process of dry or wet etching is conducted to remove the patterned photoresist layer.

Step S12 is forming a lower electrode layer 120 to cover a sidewall of each of the capacitor trenches 116. Concretely speaking, step S12, with reference to FIG. 3, comprises, but not limited to, the following steps. Firstly, a process of deposition is conducted to conformally form an electrode material such as titanium, titanium nitride, copper, etc., on the laminate structure 110. That is, the exposed surface of the sacrificial layer 114, each sidewall of the capacitor trenches 116, and the exposed surface of the substrate 100 are continually covered by the electrode material. Secondly, a process of lithography is conducted to fill a photoresist material into the capacitor trenches 116 to cover a part of the electrode material. After that, a process of chemical mechanical polishing (CMP) is conducted to remove the uncovered electrode material. In this way, the lower electrode layers 120 are formed, and each lower electrode layers 120 is shaped like, but not limited to, a hollow cylinder.

Figure 4:
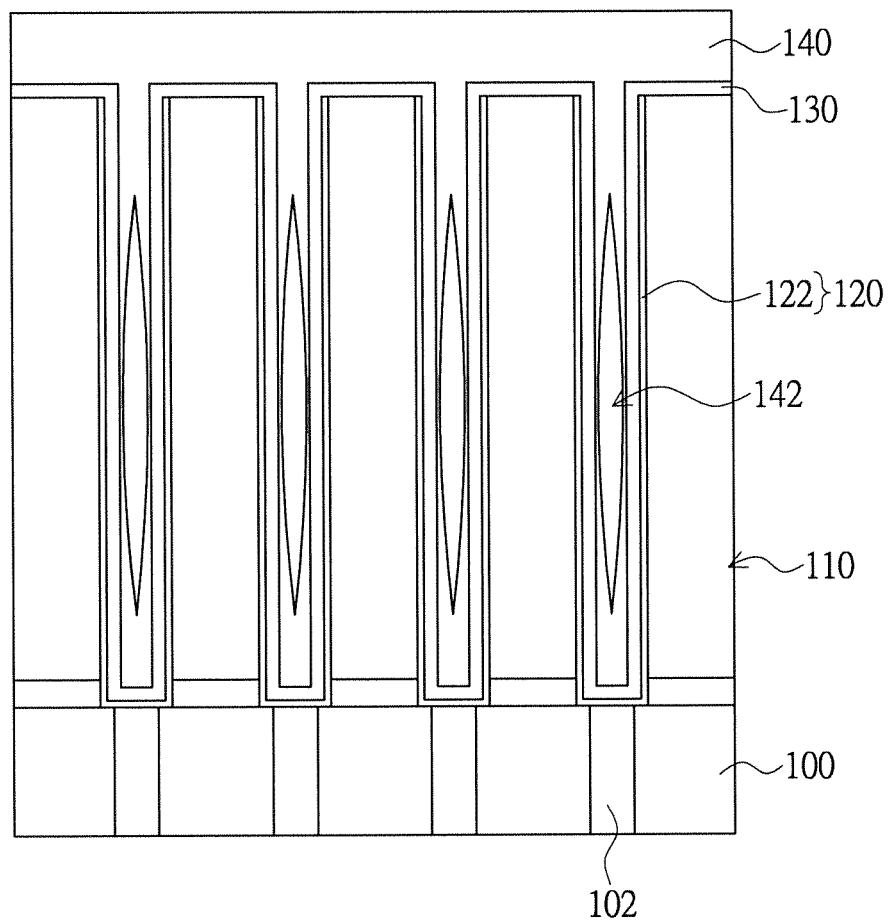

Step S13 is continually forming a first dielectric layer 130 and a first upper electrode layer 140 on the laminate structure 110, wherein the first dielectric layer 130 and the first upper electrode layer 140 are deposited over the capacitor trenches to cover a first surface 122 of each of the lower electrode layers. Referring to FIG. 4, the first dielectric layer 130, in practice, can be made of high-k dielectric material and be formed along topography via atomic layer deposition (ALD) to cover each first surface 122 of the lower electrode layers 120.

The first upper electrode layer 140 can be made of conductive material such as titanium (Ti), titanium nitride (TiN), copper (Cu), etc., and be formed on the laminate structure 110 via atomic layer deposition (ALD) or combustion chemical vapor deposition (CCVD). Most importantly, the first upper electrode layer 140 is deposited to fill the capacitor trenches 116 to cover the surface of the first dielectric layer 130. It is notable that the void spaces 142 defined by the lower electrode layer 120, based on the reduction of critical dimension, can or cannot be filled with the first upper electrode layer 140.

Figure 5:
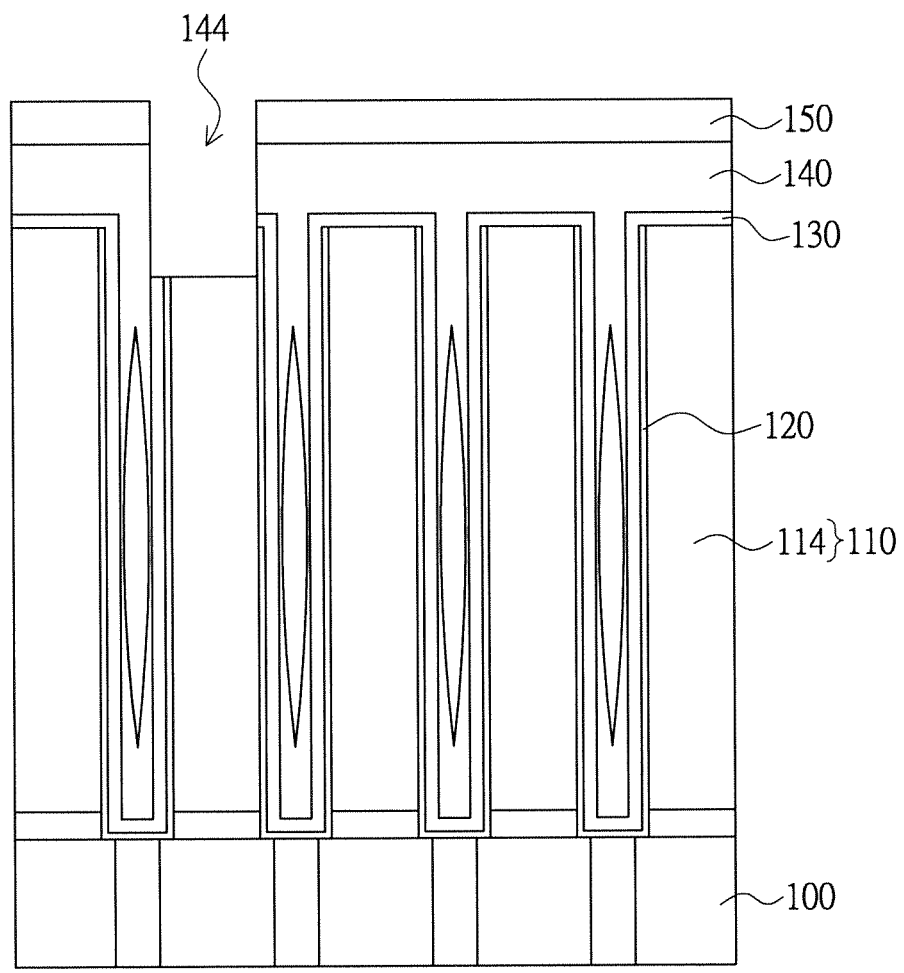

Step S14 is forming a first etch stop layer 150 on the first upper electrode layer 140. Referring to FIG. 5, the first etch stop layer 150, in practice, can be made of tungsten (W), tungsten nitride (WN), or any other conductive material and be formed on the first upper electrode layer 140 in CVD. Thus, over-etching effect on the layer structure below the first etch stop layer 150 can be prevented in the subsequent etching process.

Figure 3:
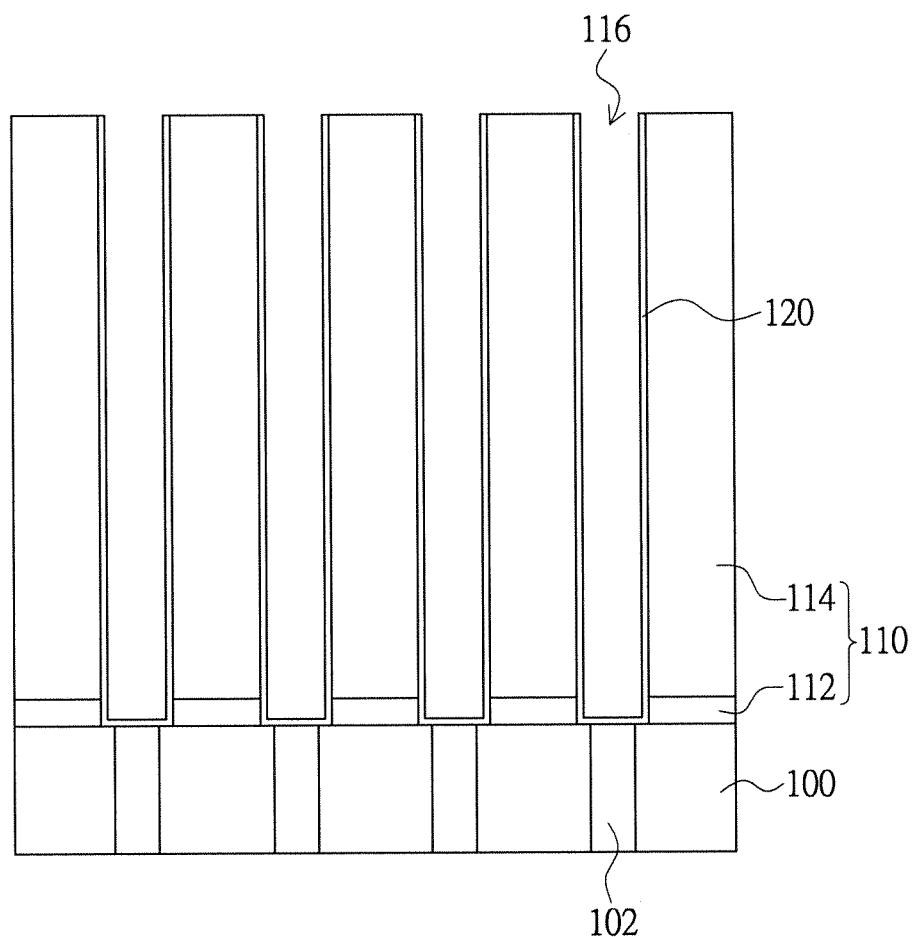

Step S15 is selectively etching the first upper electrode 140, the first dielectric layer 130, and the lower electrode layers 120 to form a plurality of openings 144. Referring to FIG. 3, step S15 comprises, but not limited to, the following steps. Firstly, a patterned photoresist layer (not shown) is formed to partially cover the first etch stop layer 150, wherein the method of forming the patterned photoresist layer is mentioned above, it is unnecessary to go into details. Secondly, an etching process is conducted to partially remove the first upper electrode 140, the first dielectric layer 130, and the lower electrode layers 120 to form the openings 144 that expose the upper portion of the sacrificial layer 114.

Figure 6:
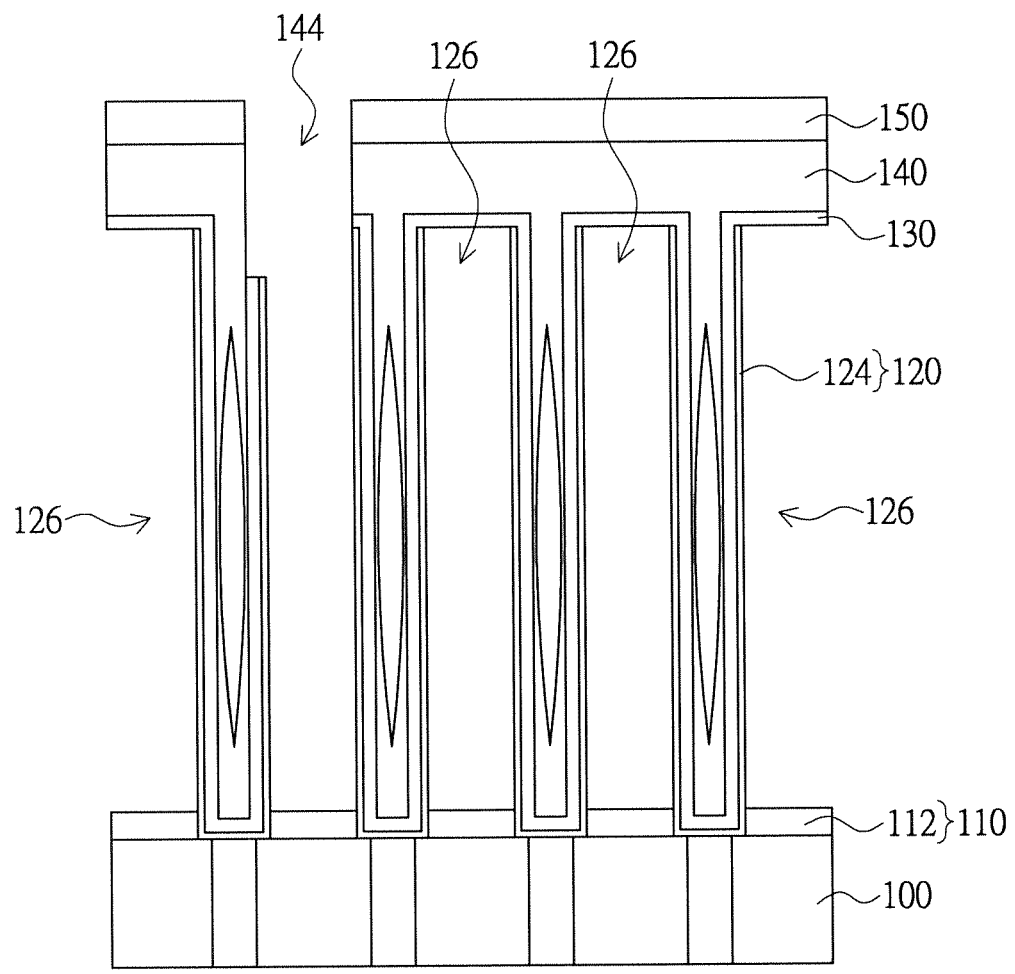

Step S16 is removing the sacrificial layer 114 of the laminate structure 110 to form a plurality of etching spaces 126 that expose a second surface 124 of each of the lower electrode layers 120. Referring to FIG. 6, the sacrificial layer 114, in practice, can be removed completely in wet-etching process. That is to say, an etching solution is used to etch the sacrificial layer 114 via the openings 144 to form the etching spaces 126 during the wet-etching process. After that, the second surfaces 124 of the lower electrode layers 120 are exposed in the etching spaces.

Specifically, the choice of etching solution is determined by the material property of the sacrificial layer 114. In this step, the etching solution can be selected to exhibit high selectivity for silicon. For example, the etching solution is selected from the group consisting of ammonia ($NH_4OH$), tetramethylammonium hydroxide (TMAH), and potassium hydroxide (NaOH). Otherwise, the HF base etching solution can be selected to exhibit high selectivity for oxide. Most importantly, the first dielectric layer 130 and the first upper electrode 140 are formed to prevent toppling of the lower electrode layers 120 due to the surface tension of drying step post wet etching. Moreover, the remained layer 112 of the laminate structure 110 can provide support for the lower electrode layers 120.

Figure 7:
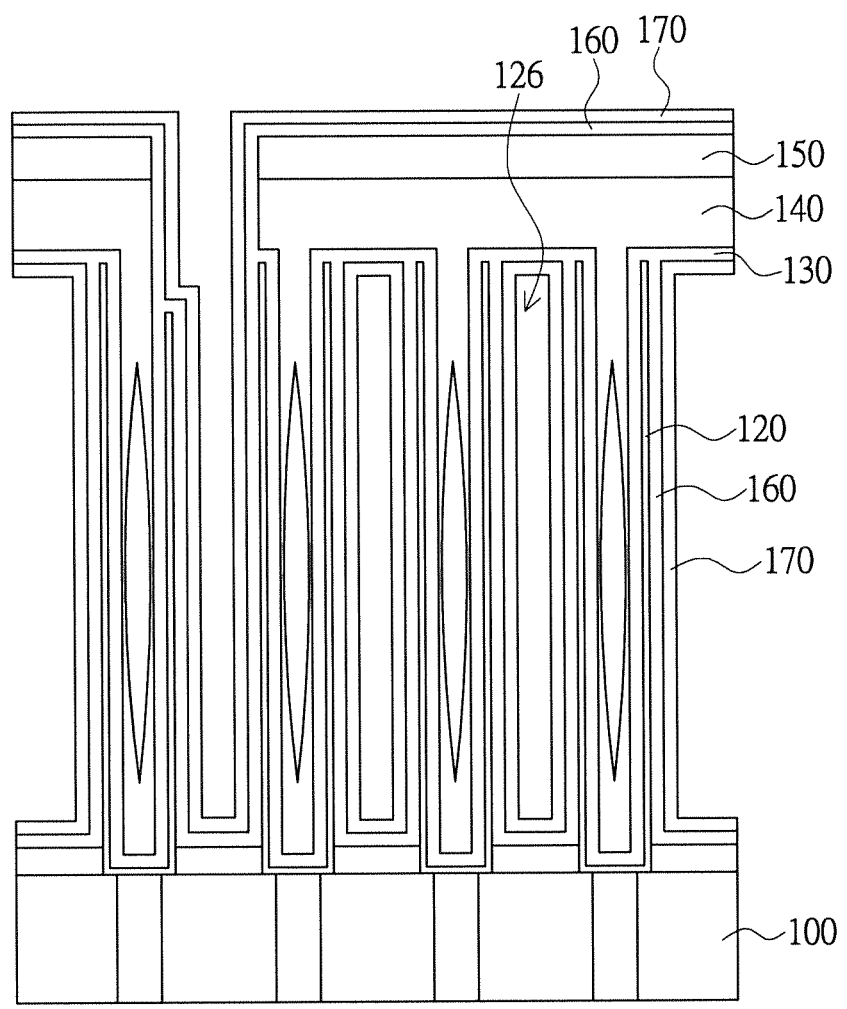

Step S17 is continually forming a second dielectric layer 160 and a second upper electrode layer 170 on the first etch stop layer 150, wherein the second dielectric layer 160 and the second upper electrode layer 170 are deposited over the etching spaces 126 to cover a second surface of each of the lower electrode layers. Referring to FIG. 7, the second dielectric layer 160, in practice, can be made of high-k dielectric material and be formed along topography of each lower electrode layer in ALD. In this way, each second surface 124 of the lower electrode layers 120 is covered by the second dielectric layer 160. The second upper electrode layer 170, in practice, can be formed along topography of the second dielectric layer 160 in ALD or CCVD, thus, the surface of the second dielectric layer 160 is covered by the second upper electrode layer 170.

To sum up in conclusion, double-side capacitors can certainly be formed through the step S11 to step S18 mentioned above, and the double-side capacitors have improved electric capacitance. Moreover, the first and second dielectric layers 130, 160 formed to cover the first and surfaces 122, 124 of the lower electrode layers 120 respectively, can be made of different materials in two steps, as well as the first and second upper electrode layers 140, 170. Consequently, the process allowance of the instant method can be improved.

Figure 1B:
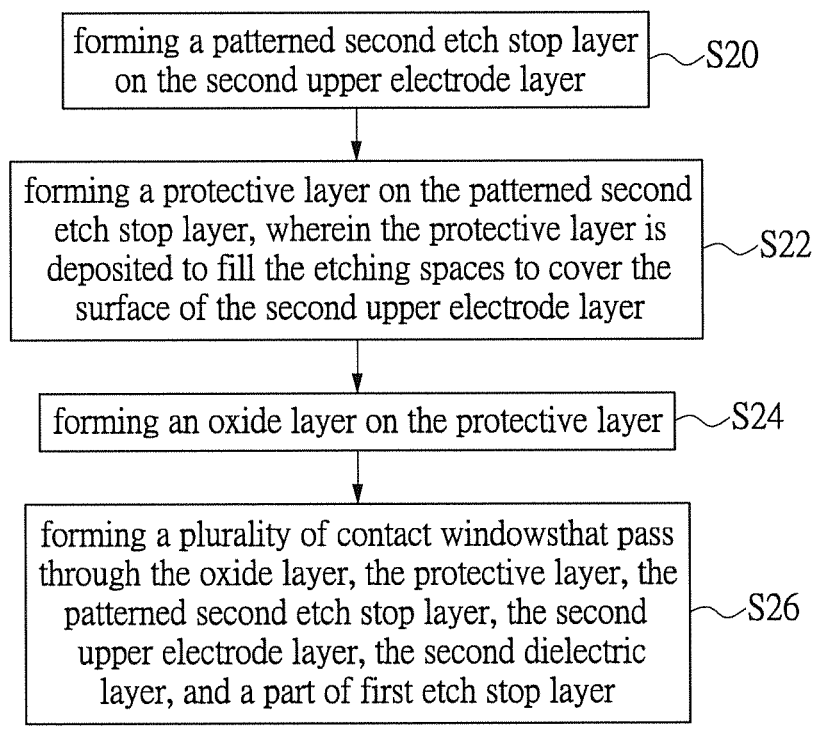
FIG. 1B shows a process flow diagram illustrating the processing steps for forming contact windows according to an embodiment of the instant disclosure.
Figure 8:
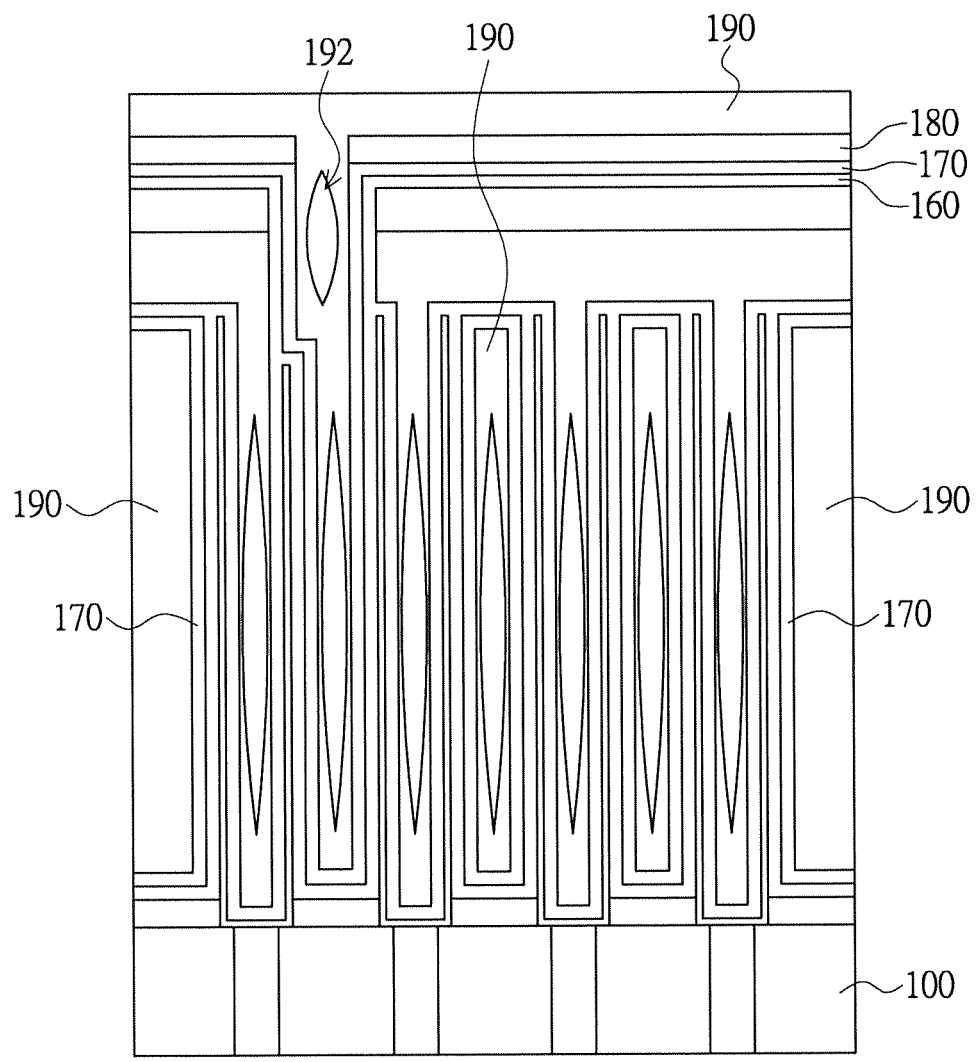
Figure 9:
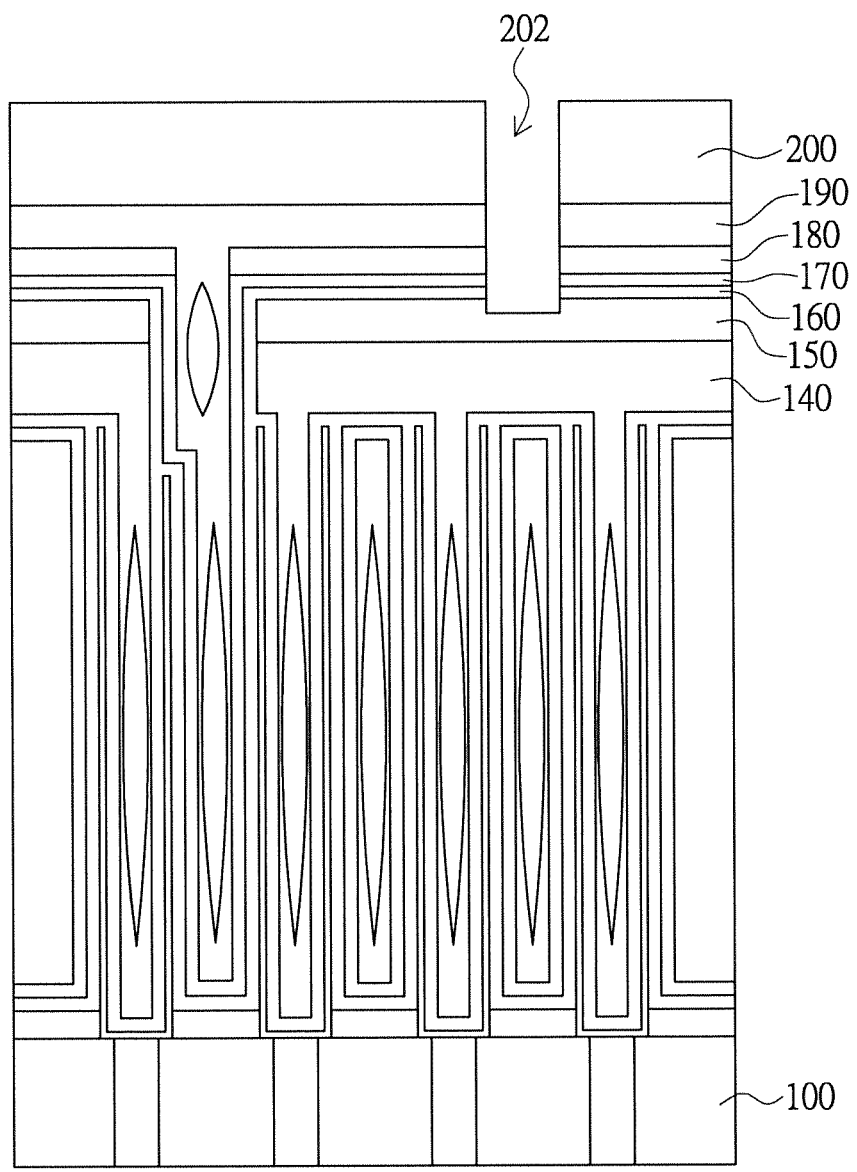

Please refer to FIG. 1B, following will further describe the method of forming contact windows which is used to electrically connect with said double-side capacitors. Thus, the instant disclosure can be performed by any person skilled in the art when understanding its features. The method comprises the following steps:

Step S20 is forming a patterned second etch stop layer 180 on the second upper electrode layer 170. Referring to FIG. 8, the second etch stop layer 180, in practice, can be made of tungsten (W), tungsten nitride (WN), or any other conductive material and be formed by CVD. Specifically, the second etch stop layer 180 can function as middle etch stop layer to highly accurate etch depth control of subsequently formed contact windows, and the uniform contact windows can be achieved.

Step S22 is forming a protective layer 190 on the patterned second etch stop layer 180, wherein the protective layer 190 is deposited to fill the etching spaces 126 to cover the surface of the second upper electrode layer 170. In practice, the protective layer 190 can be made of silicon material and be formed in CVD. Therefore, a protection is provided to the patterned second etch stop layer 180 and the second upper electrode layer 170. It is notable that the protective layer 190, based on the reduction of critical dimension, can or cannot form with void spaces 192.

Step S24 is forming an oxide layer 200 on the protective layer 190. The oxide layer 200 can be made of BPSG, PSG, or TEOS and formed in CVD.

Step S26 is forming a plurality of contact windows 202 that pass through the oxide layer 200, the protective layer 190, the patterned second etch stop layer 180, the second upper electrode layer 170, the second dielectric layer 160, and a part of first etch stop layer 150.

Concretely speaking, step S26 comprises, but not limited to, the following steps. First, a process of lithography is conducted to form a photoresist layer (not shown) on the oxide layer 200, where the photoresist layer is formed to define the critical dimension of the contact window 202. Then, an etching process is conducted to partially remove the oxide layer 200, the protective layer 190, the patterned second etch stop layer 180, the second upper electrode layer 170, the second dielectric layer 160, and a part of first etch stop layer 150 through the photoresist layer.

Based on above, the instant method for manufacturing high-strength structural stacked capacitor, in comparison with the traditional one, has the following advantages:

Firstly, for the instant method, a part of upper electrode layer is formed in one performance to cover the first/outer surface of the lower electrode before removing the sacrificial layer, and another part of upper electrode layer is formed in one performance to cover the second/inner surface of the lower electrode after removing the sacrificial layer. Hence, the structure strength of the lower electrode layer in all process steps is improved.

Secondly, the first dielectric layer and the first upper electrode are previously formed to fill the capacitor trenches to support the lower electrode layers. Therefore, the instant method can prevent the lower electrode layers from toppling in wet etching due to surface tension during wafer drying.

Further, instant method for manufacturing high-strength structural stacked capacitor can overcome limitations of the traditional one. That is to say, double-side capacitors manufactured by the instant method have larger electrode contact-surface area for increasing capacitance because of the increased height or the decreased thickness of the capacitor electrode. Consequently, the miniaturization of a semiconductor memory device including said double-side capacitors can be achieved.

Finally, the first and second dielectric layers deposited on the first and surfaces of the lower electrode layer respectively can be made of different materials in two steps, as well as the first and second upper electrode layers. In this way, the process allowance of the instant method can be improved.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method for manufacturing high-strength structural stacked capacitor, comprising the following steps:
    forming a laminate structure on a substrate, wherein the laminate structure includes a sacrificial layer disposed above the substrate;
    forming a plurality of capacitor trenches in the laminate structure;
    forming a lower electrode layer to cover a sidewall of each of the capacitor trenches;
    continually forming a first dielectric layer and a first upper electrode on the laminate structure, wherein the first dielectric layer is deposited over the capacitor trenches to cover a first surface of each of the lower electrode layers, and wherein the first upper electrode layer is deposited over the capacitor trenches to cover the surface of the first dielectric layers;
    forming a first etch stop layer on the first upper electrode layer;
    selectively removing the first upper electrode layer, the first dielectric layer, the lower electrode layers, and the first etch stop layer to form a plurality of openings that expose the sacrificial layer;
    removing the sacrificial layer to form a plurality of etching spaces between the capacitor trenches via the openings to expose a second surface of each of the lower electrode layers; and
    continually forming a second dielectric layer and a second upper electrode layer on the first etch stop layer after the sacrificial layer is removed, wherein the second dielectric layer is deposited over the etching spaces to cover each second surface of the lower electrode layers, and wherein the second upper electrode layer is deposited over the etching spaces to cover the surface of the second dielectric layer.

2. The method according to claim 1, further comprising a step of forming a patterned second etch stop layer on the second upper electrode layer after the step of continually forming a second dielectric layer and a second upper electrode on the first etch stop layer, wherein the patterned second etch stop layer exposes the openings.

3. The method according to claim 2, further comprising a step of forming a protective layer on the patterned second etch stop layer after the step of forming a patterned second etch stop layer on the second upper electrode layer, wherein the protective layer is deposited to fill the etching spaces to cover the surface of the second upper electrode layer.

4. The method according to claim 3, further comprising the steps of forming an oxide layer on the protective layer, then forming a plurality of contact windows that pass through the oxide layer, the protective layer, the patterned second etch stop layer, the second upper electrode layer, the second dielectric layer, and a part of first etch stop layer after the step of forming a protective layer on the patterned second etch stop layer.

5. The method according to claim 1, wherein the substrate includes a plurality of contact plugs, and the contact plugs are exposed to the bottom ends of the capacitor trenches respectively in the step of forming a plurality of capacitor trenches in the laminate structure.

6. The method according to claim 1, wherein the laminate structure includes a liner layer disposed between the substrate and the sacrificial layer, and the liner layer is formed to provide support or the lower electrode layers after the step of removing the sacrificial layer of the laminate structure.

7. The method according to claim 1, wherein each lower electrode layer is made of copper, titanium, or titanium nitride, the first upper electrode layer is made of copper, titanium, or titanium nitride, the second upper electrode layer is made of copper, titanium, or titanium nitride, the lower electrode layer, the first and second upper electrode layers are formed in chemical vapor deposition.

8. The method according to claim 1, wherein the first etch stop layer is made of tungsten, tungsten nitride, or silicon nitride, the second etch stop layer is made of tungsten, tungsten nitride, or silicon nitride, the first and second etch stop layers are formed in chemical vapor deposition.

\* \* \* \* \*